(12) United States Patent
Yuan et al.

(10) Patent No.: US 11,145,565 B2
(45) Date of Patent: Oct. 12, 2021

(54) METHOD OF FABRICATING A CHIP PACKAGE MODULE WITH IMPROVE HEAT DISSIPATION EFFECT

(71) Applicant: YOUNGTEK ELECTRONICS CORPORATION, Hsinchu (TW)

(72) Inventors: Hsi-Ying Yuan, Miaoli County (TW); Tung-Chuan Wang, Taoyuan (TW); Chun-Yuan Hou, Hsinchu County (TW); Ping-Lung Wang, Hsinchu (TW); Tzu-kuei Wen, Hsinchu (TW)

(73) Assignee: YOUNGTEK ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 16/897,367

(22) Filed: Jun. 10, 2020

(65) Prior Publication Data

US 2021/0043532 A1    Feb. 11, 2021

(30) Foreign Application Priority Data

Aug. 7, 2019    (TW) ................. 108128151

(51) Int. Cl.
*H01L 23/053* (2006.01)
*H01L 23/34* (2006.01)
(Continued)

(52) U.S. Cl.
CPC ........ *H01L 23/367* (2013.01); *H01L 21/4853* (2013.01); *H01L 21/4857* (2013.01); *H01L 21/4871* (2013.01); *H01L 21/565* (2013.01); *H01L 21/568* (2013.01); *H01L 21/6835* (2013.01); *H01L 23/3107* (2013.01);
(Continued)

(58) Field of Classification Search
CPC .............. H01L 21/561; H01L 21/4853; H01L 21/4857; H01L 21/4871; H01L 21/565; H01L 21/568; H01L 21/6835; H01L 23/367; H01L 23/5386; H01L 23/5389; H01L 23/3121; H01L 23/5383;
(Continued)

(56) References Cited

U.S. PATENT DOCUMENTS 6,506,632 B1    1/2003 Cheng et al.
2008/0315377 A1    12/2008 Eichelberger et al.
(Continued)

*Primary Examiner* — Alonzo Chambliss
(74) *Attorney, Agent, or Firm* — Li & Cai Intellectual Property (USA) Office

(57) ABSTRACT

A power chip package module and a manufacturing method thereof are provided. In the manufacturing method, a temporary carrier having an alignment pattern is provided, in which the temporary carrier includes a base and a peelable adhesive material disposed on the base. Thereafter, a circuit board having an accommodating space passing therethrough is disposed on the temporary carrier according to the alignment pattern. Furthermore, a chip is disposed in the accommodating space with an active surface thereof facing the temporary carrier according to the alignment pattern, in which the chip is fixed on the temporary carrier by the peelable adhesive material. The accommodating space is filled with a molding material to form an initial package structure. The initial package structure is separated from the temporary carrier, and then an electrically and thermally conductive layer is formed on a bottom surface of the chip and is in contact therewith.

15 Claims, 7 Drawing Sheets

(51) Int. Cl.
*H01L 23/48* (2006.01)
*H01L 21/00* (2006.01)
*H05K 7/20* (2006.01)
*H05K 7/00* (2006.01)
*H01L 23/367* (2006.01)
*H01L 23/538* (2006.01)
*H01L 23/00* (2006.01)
*H01L 21/683* (2006.01)
*H01L 21/48* (2006.01)
*H01L 21/56* (2006.01)
*H01L 23/31* (2006.01)
*H01L 23/498* (2006.01)

(52) U.S. Cl.
CPC .......... *H01L 23/3121* (2013.01); *H01L 23/34* (2013.01); *H01L 23/49822* (2013.01); *H01L 23/49838* (2013.01); *H01L 23/5383* (2013.01); *H01L 23/5386* (2013.01); *H01L 23/5389* (2013.01); *H01L 24/19* (2013.01); *H01L 24/20* (2013.01); *H01L 2221/68309* (2013.01); *H01L 2221/68372* (2013.01); *H01L 2221/68386* (2013.01); *H01L 2224/214* (2013.01)

(58) Field of Classification Search
CPC ......... H01L 24/19; H01L 24/20; H01L 23/34; H01L 23/49838; H01L 23/49822; H01L 23/3107
See application file for complete search history.

(56) References Cited

U.S. PATENT DOCUMENTS

| | | | |
|---|---|---|---|
| 2014/0103527 A1* | 4/2014 | Marimuthu | H01L 23/3128 257/737 |
| 2014/0312481 A1* | 10/2014 | Choi | H01L 25/50 257/686 |
| 2015/0001708 A1 | 1/2015 | Lin | |
| 2015/0348936 A1* | 12/2015 | Lin | H01L 21/568 257/659 |
| 2016/0079214 A1* | 3/2016 | Caskey | H01L 23/3114 257/686 |

* cited by examiner

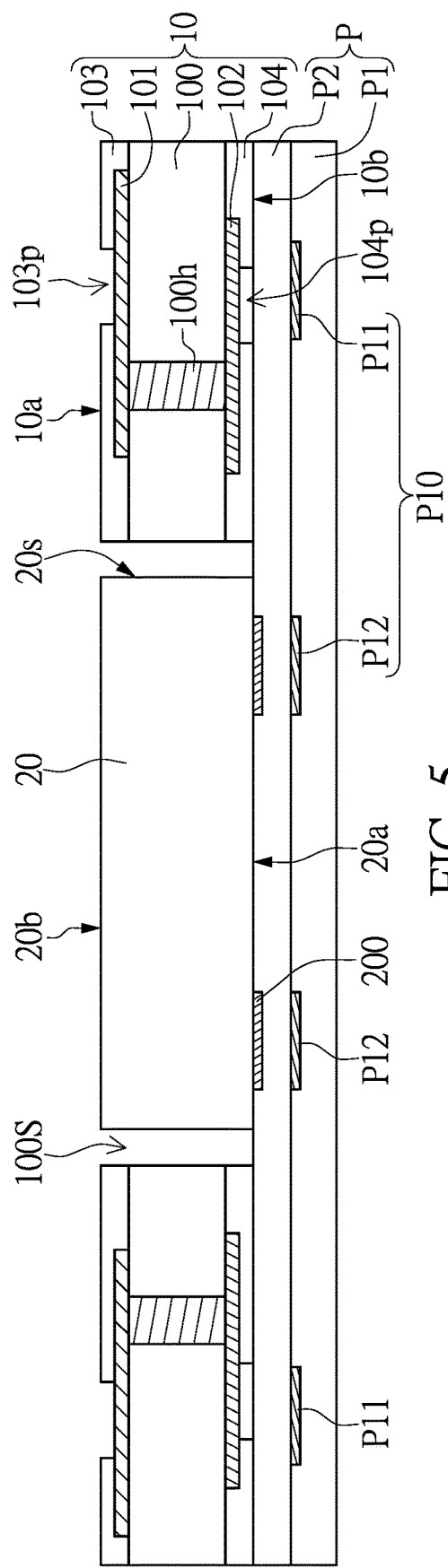
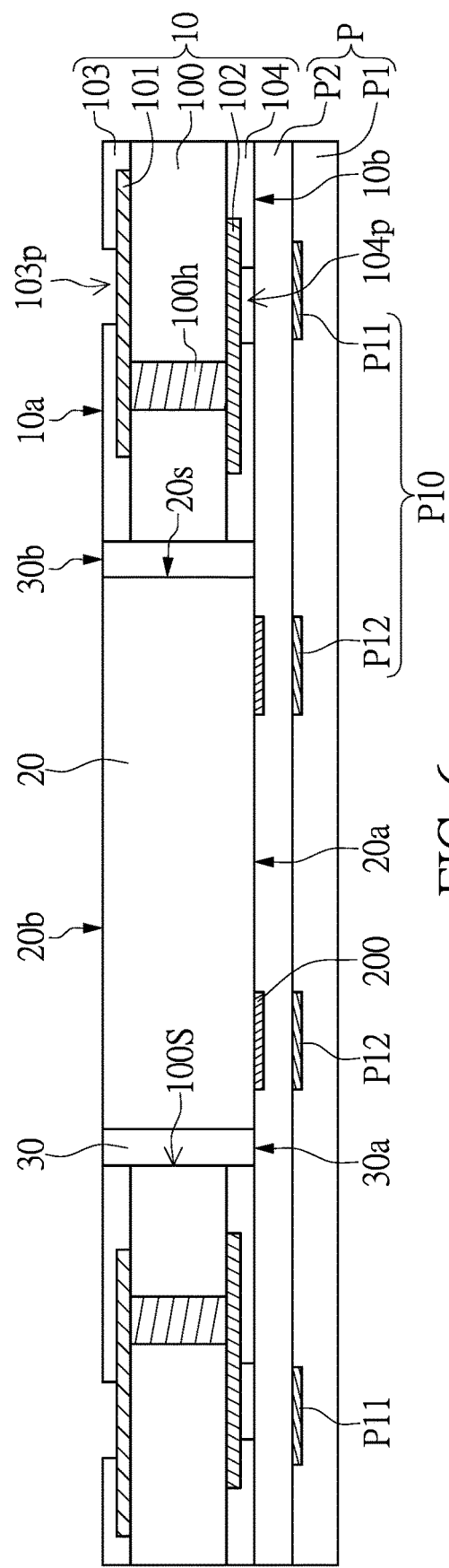
FIG. 5
FIG. 6

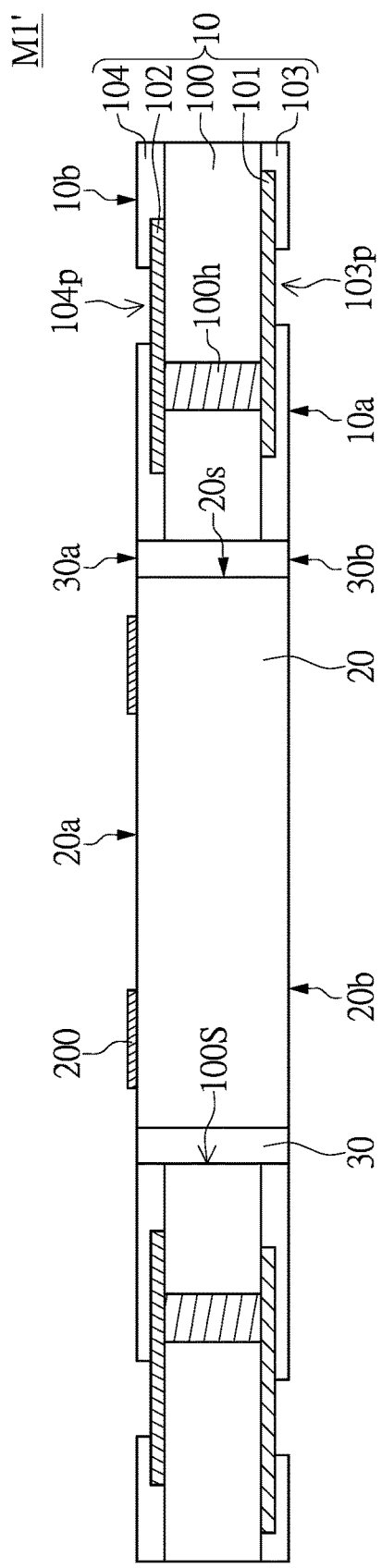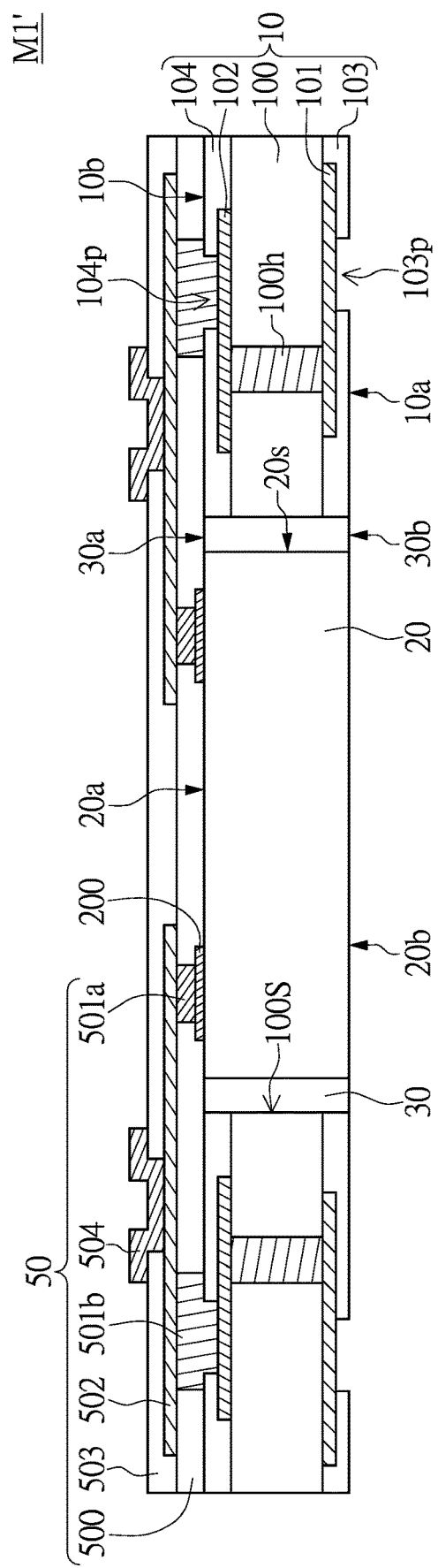

METHOD OF FABRICATING A CHIP PACKAGE MODULE WITH IMPROVE HEAT DISSIPATION EFFECT

CROSS-REFERENCE TO RELATED PATENT APPLICATION

This application claims the benefit of priority to Taiwan Patent Application No. 108128151, filed on Aug. 7, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a chip package module and a manufacturing method thereof, and more particularly to a chip package module with heat dissipation function and a manufacturing method thereof.

BACKGROUND OF THE DISCLOSURE

A power component can be used in a power conversion circuit or a control circuit and is the core component for power processing in an electronic product. As electronic products tend to become lighter and slimmer, the package structure of power components used in electronic products have also become slimmer, and has higher power and density.

Since the power component usually operates under conditions of high current or high voltage, the heat produced by the power component would raise the temperature thereof. If the heat is not dissipated from the power component in a timely manner, the power component may not work normally due to an excessively high temperature. In addition, if the power component often operates under excessive temperatures, the lifespan of the power component would be shortened.

The U.S. Pat. No. 6,506,632 discloses a method of integrated circuit package. Firstly, a core layer and an electrically conductive layer are attached to each other, and the electrically conductive layer is attached on a second surface of the core layer to form a substrate. Thereafter, a first opening is formed on the substrate to expose a part of the electrically conductive layer. Subsequently, the chip is attached on the exposed part of the electrically conductive layer with a back surface thereof facing the electrically conductive layer, and a front surface of the chip has a plurality of connecting pads. The first opening is filled with a dielectric layer, and the dielectric layer covers the front surface and the connecting pads of the chip. Afterward, a plurality of through holes, a patterned metal layer and a plurality of solder balls are formed to electrically connect the connecting pads of the chip.

However, in the above-mentioned manufacturing method, the chip can be not in direct contact with the electrically conductive layer, but may be fixed on the electrically conductive layer by an adhesive layer. Due to the poor thermal conductivity of the adhesive layer, the heat dissipation effect on the chip would not be ideal. In addition, in the step of forming the first opening to expose the part of the electrically conductive layer, the surface of the electrically conductive layer would be uneven. If the chip is not fixed on the electrically conductive layer by the adhesive layer, it will be difficult to adhere the bottom surface of the chip on the surface of the electrically conductive layer.

On the other hand, the alignment accuracy can be poor when the chip is being disposed in the first opening. Moreover, when filling the first opening with the dielectric layer, the chip may be displaced or rotated by an angle. Since the through holes and the patterned metal layer are subsequently formed corresponding to the preset position of the chip, if the chip is misaligned or shifted from the preset position when filling the dielectric layer, the through holes and the patterned metal layer will be misaligned with the chip and results in the inability to establish an electrical connection between the patterned metal layer and the chip or cause a short circuit to occur. Particularly, the problem caused by inaccurate alignment will be more serious when the quantity of solder pads on the chip is large or the arrangement thereof is dense.

SUMMARY OF THE DISCLOSURE

In response to the above-referenced technical inadequacies, the present disclosure provides a chip package module with heat dissipation function and a manufacturing method thereof.

In one aspect, the present disclosure provides a manufacturing method of chip package module with heat dissipation function, including: providing a temporary carrier having an alignment pattern, in which the temporary carrier includes a base and a peelable adhesive material disposed on the base; disposing a circuit board having a chip accommodating space passing therethrough on the temporary carrier according to the alignment pattern; disposing a chip with an active surface thereof facing the temporary carrier in the chip accommodating space according to the alignment pattern, in which the chip is fixed on the temporary carrier by the peelable adhesive material; filling the chip accommodating space with a molding material so that the chip can be connected to and fixed on the circuit board, and therefore an initial package structure is formed; separating the initial package structure from the temporary carrier, in which the bottom surface of the chip is exposed from a bottom side of the initial package structure; and forming an electrically and thermally conductive layer at the bottom side of the initial package structure, in which the electrically and thermally conductive layer is in direct contact with the bottom surface of the chip and covers the bottom surface of the chip.

In another aspect, the present disclosure provides a chip package module with heat dissipation function including a circuit board, a chip, a molding material, and an electrically and thermally conductive layer. The circuit board has a chip accommodating space passing therethrough. The chip is disposed in the chip accommodating space, and the chip has an active surface and a bottom surface opposite to the active surface. The molding material is filled between a side surface of the chip and a side wall defining the chip accommodating space, so that the chip is fixed on the circuit board. The electrically and thermally conductive layer is disposed on the bottom surface of the chip and is in contact therewith.

Therefore, the chip package module with heat dissipation function and a manufacturing method thereof provided in the present disclosure can improve on the accuracy of the alignment between the circuit board and the chip through the aspects of "providing a temporary carrier having an alignment pattern", "disposing a circuit board on the temporary carrier according to the alignment pattern" and "disposing a chip with an active surface thereof facing the temporary carrier in the chip accommodating space according to the alignment pattern". In addition, the chip package module with heat dissipation function provided in the present disclosure can improve on the heat dissipation effect of the electrically and thermally conductive layer on the chip through the aspect of "an electrically and thermally conductive layer is disposed on the bottom surface and is in contact therewith".

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

FIG. 5 is a cross-sectional view of the chip package module in step S120 of the manufacturing method according to the embodiment of the present disclosure.

FIG. 6 is a cross-sectional view of the chip package module in step S130 of the manufacturing method according to the embodiment of the present disclosure.

FIG. 8 and FIG. 9 are cross-sectional views of the chip package module in step S150 of the manufacturing method according to the embodiment of the present disclosure.

DETAILED DESCRIPTION OF THE EXEMPLARY EMBODIMENTS

Figure 1:
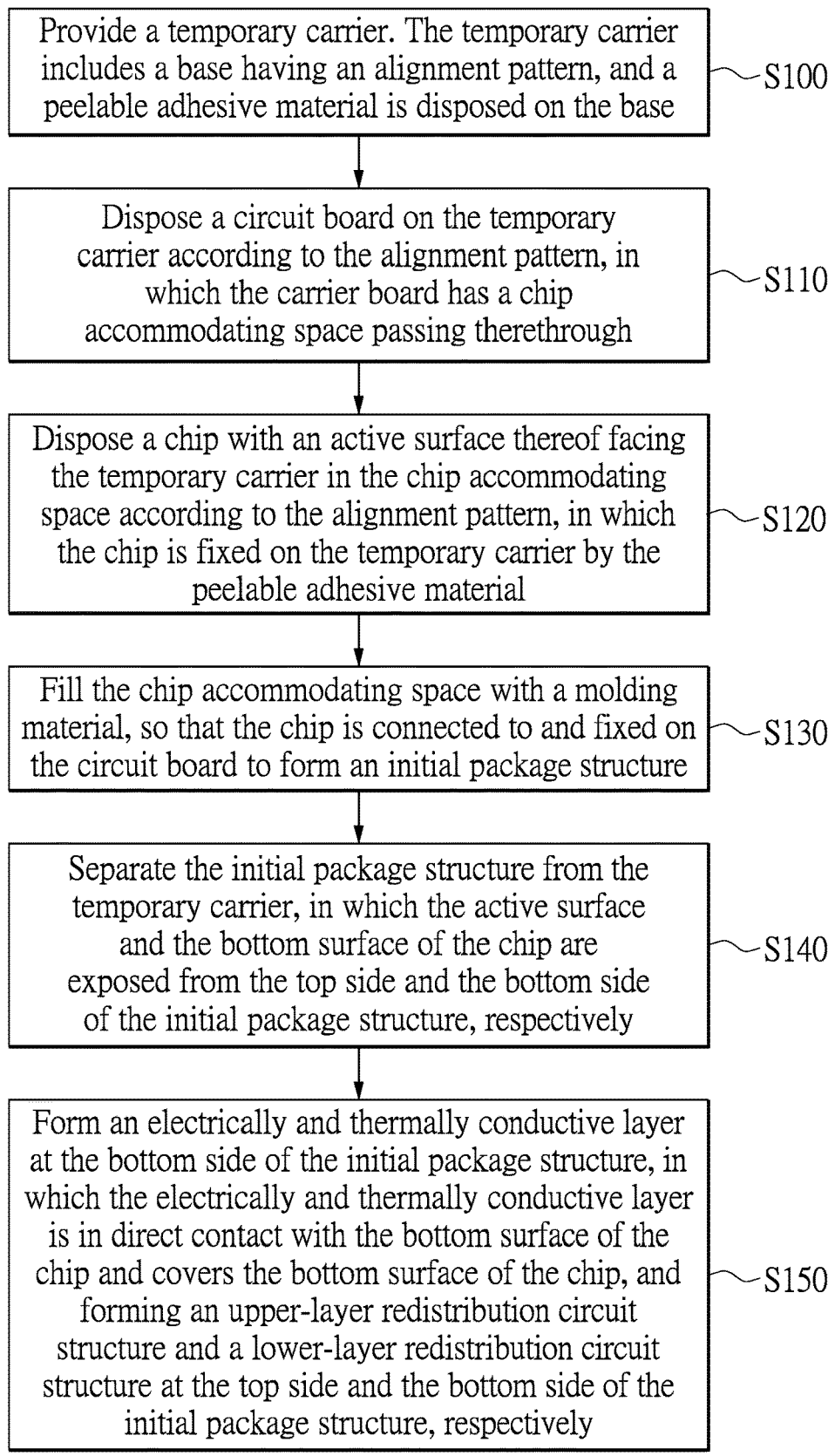
FIG. 1 is a flow chart of a manufacturing method of chip package module with heat dissipation function according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Reference is made to FIG. 1, which is a flow chart of a manufacturing method of chip package module with heat dissipation function according to an embodiment of the present disclosure. The manufacturing method provided in the embodiment of the present disclosure can be used to package various types of chips, such as power chips.

As shown in FIG. 1, in step S100, a temporary carrier is provided. The temporary carrier includes a base having an alignment pattern and a peelable adhesive material disposed on the base. In step S110, a circuit board is disposed on the temporary carrier according to the alignment pattern, in which the circuit board has a chip accommodating space passing therethrough.

In step S120, the chip is disposed in the chip accommodating space with an active surface thereof facing the temporary carrier according to the alignment pattern. Thereafter, in step S130, the chip accommodating space is filled with a molding material so that the chip is connected to and fixed on the circuit board, and therefore an initial package structure is formed.

In step S140, the initial package structure is separated from the temporary carrier. Thereafter, in step S150, an electrically and thermally conductive layer is formed at a bottom side of the initial package structure, and the electrically and thermally conductive layer is in direct contact with the bottom surface of the chip and covers the bottom surface of the chip. In addition, a lower-layer redistribution circuit structure and an upper-layer redistribution circuit structure are formed at the bottom side and a top side of the initial package structure, respectively.

Figure 2A:
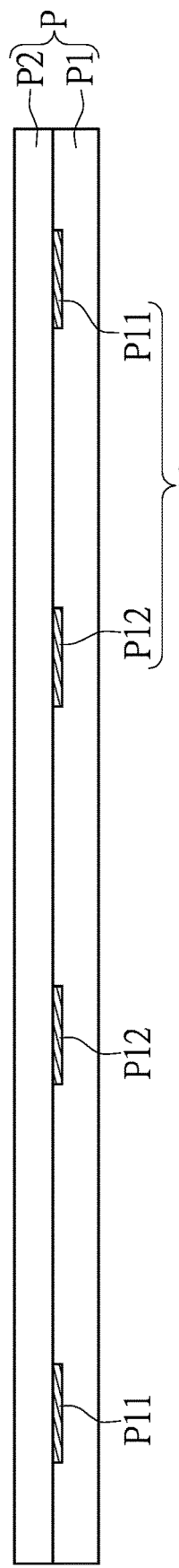
FIG. 2A is a cross-sectional view of a temporary carrier according to the embodiment of the present disclosure.
Figure 2B:
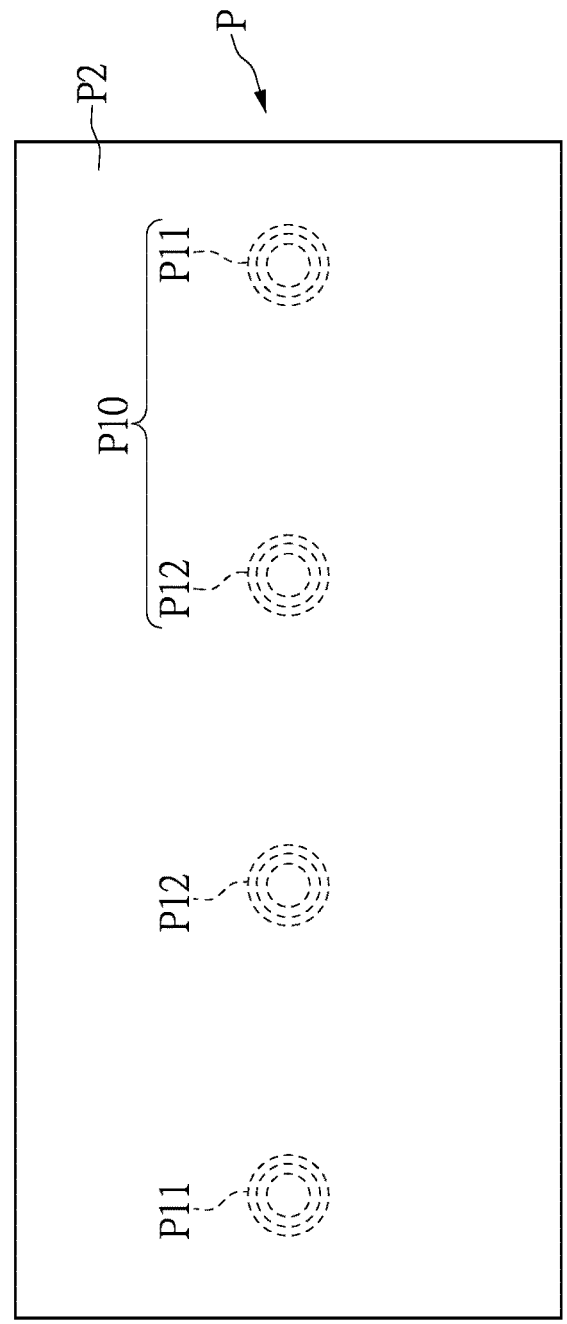
FIG. 2B is a top view of the temporary carrier according to the embodiment of the present disclosure.

The process of the manufacturing method of chip package module with heat dissipation function of the embodiment of the present disclosure will be introduced in detail below. Reference is made to step S100 of FIG. 1, which is to be read in conjunction with FIG. 2A and FIG. 2B.

A temporary carrier P includes a base P1 and a peelable adhesive material P2 disposed on the base P1. In the embodiment of the present disclosure, the base P1 can be made of silicon wafer, glass, ceramics, polymer material, or metal material, and an alignment pattern P10 is formed on the base P1.

The alignment pattern P10 includes at least one circuit board alignment mark P11 (which are exemplified as two in the figures of the present disclosure) and at least one chip alignment mark P12 (which are exemplified as two in the figures of the present disclosure). In the present disclosure, the quantities of the circuit board alignment mark P11 and the chip alignment mark P12 are not intended to be limited to those disclosed herein. In addition, in the present embodiment, the peelable adhesive material P2 is transparent so as to prevent the alignment pattern P10 on the base P1 from being covered.

Figure 3:
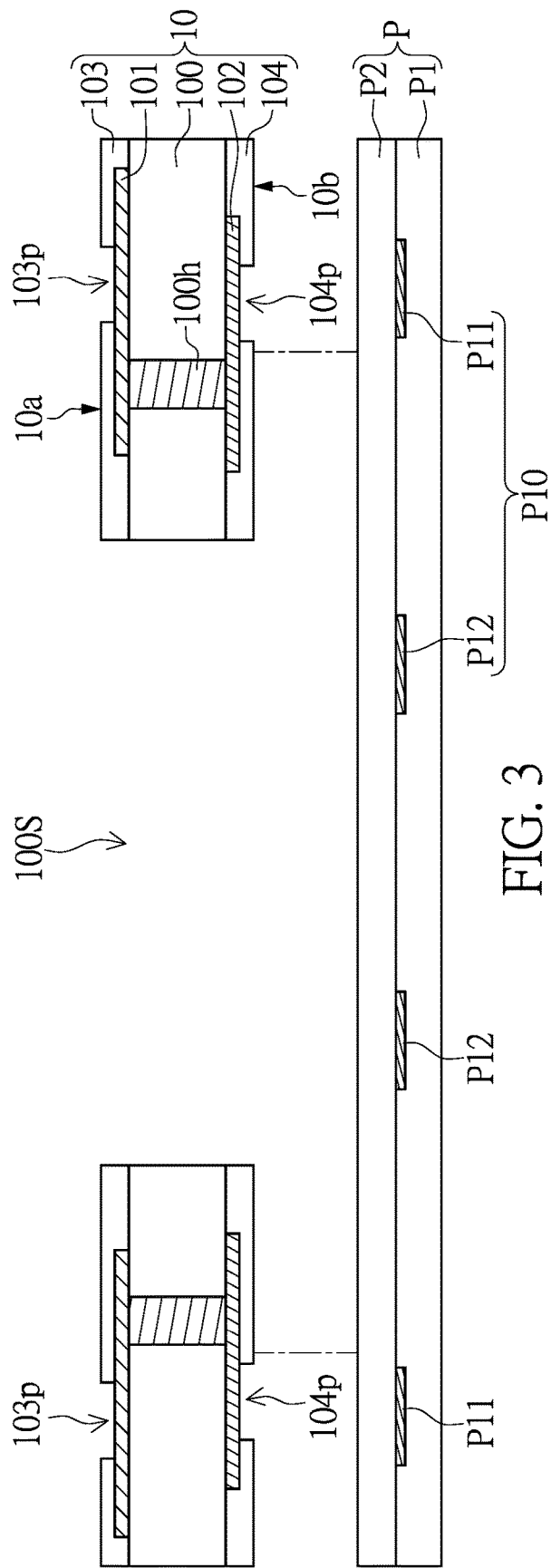
FIG. 3 and FIG. 4 are cross-sectional views of a chip package module in step S110 of the manufacturing method according to the embodiment of the present disclosure.
Figure 4:
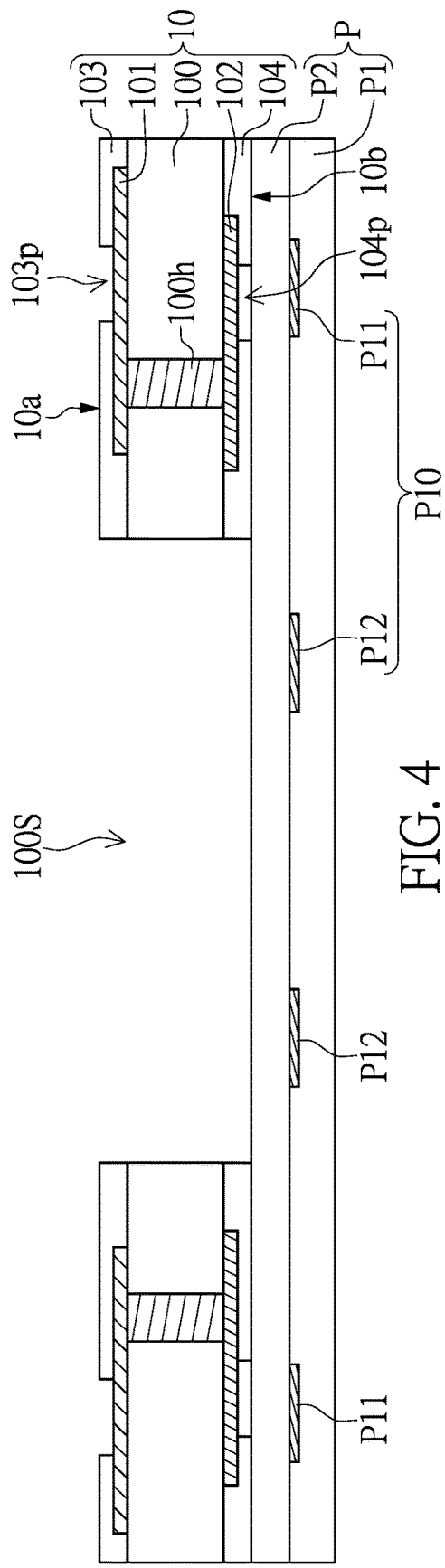

Reference is made to step S110 of FIG. 1, which is to be read in conjunction with FIG. 3 and FIG. 4. A circuit board 10 includes a first surface 10a and a second surface 10b opposite to the first surface 10a. In the present embodiment, the circuit board 10 has a pre-formed interconnect circuit and a chip accommodating space 100S passing through the circuit board 10.

Specifically, as shown in FIG. 3, the circuit board 10 is a composite plate having a multi-layer structure, and the circuit board 10 at least includes a core substrate 100, a first wire layer 101, a second wire layer 102, a first dielectric layer 103, and a second dielectric layer 104.

The core substrate 100 can be made of polymer, plastic, ceramics, metal, silicon wafer, composite material (e.g., fiberglass FR4 or BT resin), glass, or flexible soft material, but the present disclosure is not intended to be limited thereto. In the present embodiment, the core substrate 100 further has at least one electrically conductive through hole 100h (which are exemplified as two in FIG. 1) passing through the core substrate 100.

The first wire layer 101 and the second wire layer 102 are respectively disposed on two opposite sides of the core substrate 100 and electrically connected to each other through the electrically conductive through holes 100h. Furthermore, the first wire layer 101 and the second wire layer 102 can be formed by microlithography and can have different circuit patterns.

The first wire layer 101 and the second wire layer 102 can be made of metal, alloy, or electrically conductive composite materials. Such metal or alloy can be selected from a group consisting of copper, silver, nickel, gold, tin, and any combination thereof. In a certain embodiment, the materials of first wire player 101 and the second wire layer 102 can be, for example, copper/nickel/gold and copper/nickel/tin. In addition, the electrically conductive composite material can be, for example, silver paste or carbon paste.

The first dielectric layer 103 and the second dielectric layer 104 are disposed on two opposite side of the core substrate 100, respectively. In the present embodiment, the first dielectric layer 103 and the second dielectric layer 104 are the two outermost layers of the circuit board 10, respectively. That is, the first surface 10a of the circuit board 10 includes an outer surface of the first dielectric layer 103, and the second surface 10b of the circuit board 10 includes an outer surface of the second dielectric layer 104.

Furthermore, the first dielectric layer 103 is disposed on the first wire layer 101 and has a first opening pattern 103p to expose a part of the first wire layer 101. In addition, the second dielectric layer 104 is disposed on the second wire layer 102 and has a second opening pattern 104p to expose a part of the second wire layer 102.

The first dielectric layer 103 and the second dielectric layer 104 can be made of insulating adhesive material, e.g., polyimide, benzocyclobutene (BCB), silica gel, resin, solder mask, or composite materials.

In addition, as shown in FIG. 3, the chip accommodating space 100S extends from the first surface 10a of the circuit board 10 to the second surface 10b of the circuit 10. Accordingly, in the embodiment of the present disclosure, a part of the core substrate 100, a part of the first dielectric layer 103 and a part of the second dielectric layer 104 would be exposed from a side wall (which is not labeled in FIG. 3) defining the chip accommodating space 100S. In another embodiment, a part of the first wire layer 101 or a part of the second wire layer 102 would also be exposed from the side wall defining the chip accommodating space 100S.

As shown in FIG. 3 and FIG. 4, when disposing the circuit board 10 onto the temporary carrier P, the circuit board 10 is being disposed on the temporary carrier P corresponding to at least one circuit board alignment mark P11. The circuit board 10 is fixed on the temporary carrier P by the peelable adhesive material P2, and the chip alignment mark P12 would be exposed from the chip accommodating space 100S. That is, after the circuit board 10 is disposed on the temporary carrier P, the chip alignment mark P12 would not be covered by the circuit board 10.

Reference is made to step S120 of FIG. 1, which is to be read in conjunction with FIG. 5. A chip 20 is disposed in the chip accommodating space 100S. The chip 20 is fixed on the temporary carrier P by the peelable adhesive material P2.

As shown in FIG. 5, the chip 20 has an active surface 20a and a bottom surface 20b opposite to the active surface 20a. In addition, at least one solder pad 200 (which are exemplified as two in FIG. 5) is disposed on the active surface 20a of the chip 20. In the embodiment of the present disclosure, the active surface 20a of the chip 20 and the second wire layer 102 are disposed facing the same direction. That is, solder pads 200 of the chip 20 and the second wire layer 102 are disposed on the same side of the core substrate 100.

In the step of disposing the chip 20 into the chip accommodating space 100S, the solder pads 200 on the active surface 20a are disposed on the temporary carrier plate P in alignment with the corresponding chip alignment mark P12. It should be noted that, in the present embodiment, the solder pads 200 are partially embedded into the peelable adhesive material P2 when the chip 20 is disposed in the chip accommodating space 100S.

In addition, as shown in FIG. 5, the size of the chip accommodating space 100S will be slightly greater than the size of the chip 20, so that a gap (which is not labeled in FIG. 5) will be defined by the side wall defining the chip accommodating space 100S and a side surface 20s of the chip 20.

In the embodiment of the present disclosure, the thickness of the chip 20 is approximately the same as the thickness of the circuit board 10. Accordingly, the thickness of the chip 20 would be greater than the thickness of the core substrate 100 of the circuit board 10.

Reference is made to step S130 of FIG. 1, which is to be read in conjunction with FIG. 6. The chip accommodating space 100S is filled with a molding material 30. Furthermore, the molding material 30 is filled between the side surface 20s of the chip 20 and one side wall defining the chip accommodating space 100S, so that the chip 20 is connected to and fixed on the circuit board 10, so as to form an initial package structure M1'.

The molding material 30 can be made of polymer material (e.g., polyimide, benzocyclobutene), insulating adhesive material (e.g., silica gel, resin, composite material), or dielectric material, so that the chip 20 can be fixed in the circuit board 10.

In the embodiment of the present disclosure, the molding material 30 would cover the side surface 20s of the chip 20, and an outer surface 30a of the molding material 30 and the second surface 10b of the circuit board are coplanar. In addition, the molding material 30 would not completely cover the back surface 20b of the chip 20. That is, at least a part of the bottom surface 20b of the chip 20 would be exposed from an outer surface of the initial package structure M1'.

In a certain embodiment, in the case of the thickness of the chip 20 is less than the thickness of the circuit board 10, when filling the molding material 30, the molding material 30 may completely cover the bottom surface 20b of the chip 20. Therefore, the manufacturing method of the embodiment of the present disclosure can further include performing a cleaning step on the molding material 30 to remove a part of the molding material 30 which covers the bottom surface 20b of the chip 20, so that at least a part of the bottom surface 20b of the chip (e.g., a middle area) can be exposed.

It should be noted that, under the various process conditions or restrictions, the molding material 30 may partially cover a peripheral area of the bottom surface 20b of the chip 20. Therefore, as long as the middle area of the bottom surface 20b of the chip is not covered by the molding material 30, the present disclosure does not limit that the molding material 30 on the bottom surface 20b of the chip 20 should be completely removed.

In addition, it should be noted that, in the embodiment of the present disclosure, since the solder pads 200 on the active surface 20a are embedded into the peelable adhesive material P2, when filling the molding material 30, the molding material 30 would not cover the solder pads 200.

Figure 7:
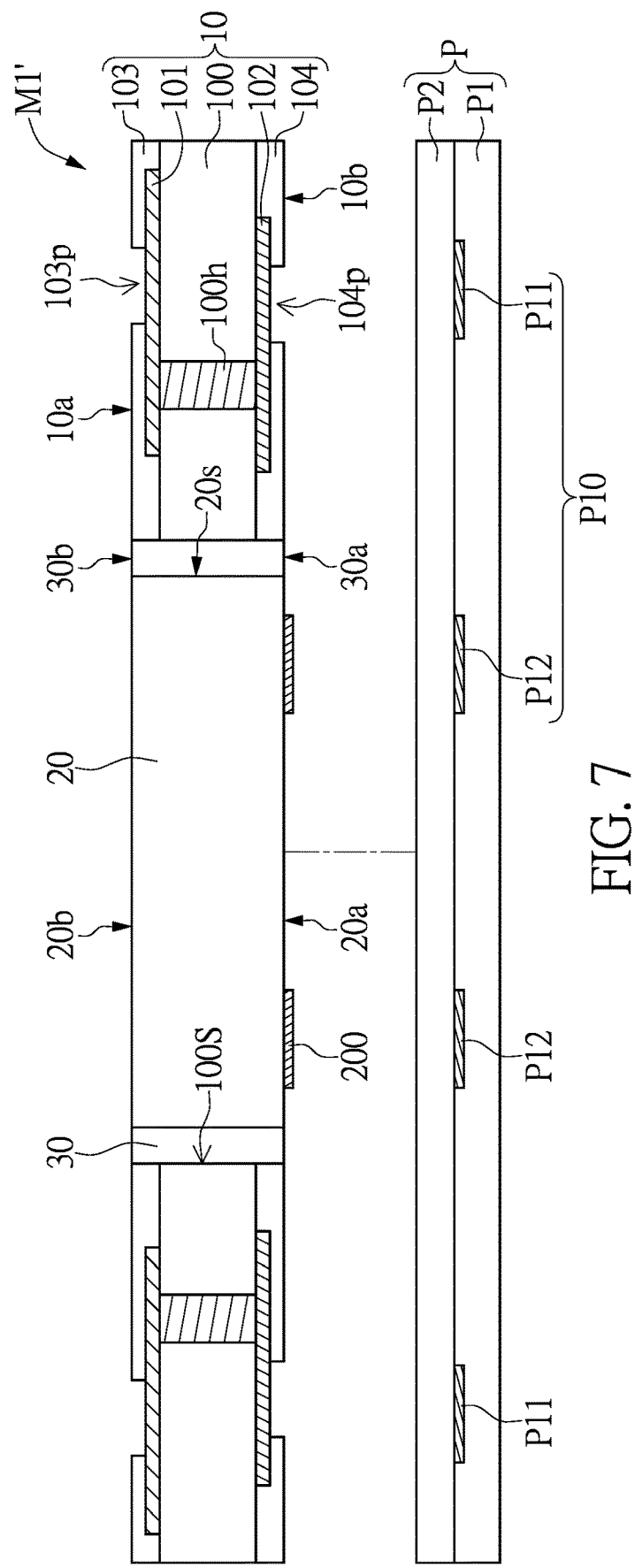
FIG. 7 is a cross-sectional view of the chip package module in step S140 of the manufacturing method according to the embodiment of the present disclosure.

Reference is made to step S140 of FIG. 1, which is to be read in conjunction with FIG. 7 and FIG. 8. The initial package structure M1' is separated from the temporary carrier P. Since the bonding force between the peelable adhesive material P2 and the base P1 is greater than the bonding force between the peelable adhesive material P2 and the initial package structure M1', the initial package structure M1' and the temporary carrier P can be separated by an external force without damaging the initial package structure M1'.

In addition, as shown in FIG. 8, the active surface 20a and the bottom surface 20b of the chip 20 are exposed from a top side and a bottom side of the initial package structure M1', respectively. Furthermore, as described previously, the solder pads 200 on the active surface 20a of the chip 20 would also be exposed from the top side of the initial package structure M1'.

Figure 10:
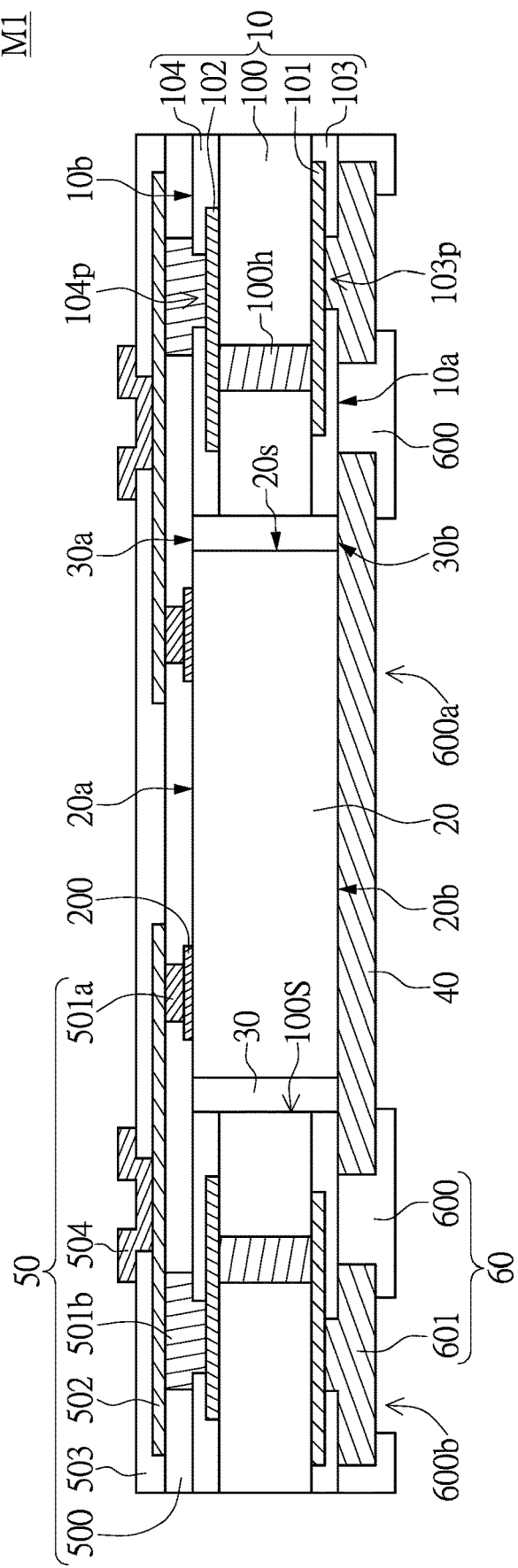
FIG. 10 is a cross-sectional view of the chip package module according to the embodiment of the present disclosure.

Furthermore, reference is made to step S150 of FIG. 1, which is to be read in conjunction with FIG. 9 and FIG. 10. An electrically and thermally conductive layer 40 is formed at the bottom side of the initial package structure M1' to be in direct contact with the bottom surface 20b of the chip 20 and covers the bottom surface 20b of the chip 20. In addition, an upper-layer redistribution circuit structure 50 and a lower-layer redistribution circuit structure 60 are formed on the top side and the bottom side of the initial package structure M1', respectively.

In the present embodiment, the upper-layer redistribution circuit structure 50 is formed firstly; thereafter, the electrically and thermally conductive layer 40 and the lower-layer redistribution circuit structure 60 are formed. However, the order of forming the electrically and thermally conductive layer 40, the upper-layer redistribution circuit structure 50, and the lower-layer redistribution circuit structure 60 is not limited in the present disclosure.

As shown in FIG. 9, the upper-layer redistribution circuit structure 50 is disposed on the second surface 10b of the circuit board 10 and is electrically connected to the chip 20. In other words, the chip 20 can be electrically connected to an external circuit through the upper-layer redistribution circuit structure 50 and the circuit board 10.

In the present embodiment, the step of forming the upper-layer redistribution circuit structure 50 includes forming a first upper dielectric layer 500, a plurality of electrically conductively pillars 501a, 501b, an interconnect circuit layer 502, a second upper dielectric layer 503, and an upper metallic solder pad 504.

More specifically, the first upper dielectric layer 500 is formed to cover the active surface 20a of the chip 20 and the second surface 10b (which is also the surface of the second dielectric layer 104) of the circuit board 10. The first upper dielectric layer 500 has a plurality of contact windows corresponding to the second wire layer 102 exposed from the second opening pattern 104p of the second dielectric layer 104 and correspond to the solder pads 200 of the chip 20.

Subsequently, at least one electrically conductive pillar 501a is formed in the contact windows of the first upper dielectric layer 500 to electrically connect to the solder pads 200 of the chip 20. In addition, another electrically conductive pillar 501b is formed passing through the contact windows of the first upper dielectric layer 500 and the second opening pattern 104p of the second dielectric layer 104 to electrically connect to the second wire layer 102. Thereafter, the interconnect circuit layer 502 is formed on the first upper dielectric layer 500 and electrically connected to the solder pads 200 of the chip 20 and the second wire layer 102 through the electrically conductive pillars 501a, 501b in the contact windows.

Afterwards, the second upper dielectric layer 503 is formed on the interconnect circuit layer 502, and the second upper dielectric layer 503 has at least one opening (which are exemplified as two in FIG. 9), so that part of a surface of the interconnect circuit layer 52 is exposed. Thereafter, the upper metallic solder pad 504 can be disposed in the openings to electrically connect the external circuit. Accordingly, each one of the solder pads 200 of the chip 20 can be electrically connected to the upper metallic solder pad 504 through the electrically conductive pillars 501a, 501b and the interconnect circuit layer 502.

Referring to FIG. 10, in the present embodiment, the electrically and thermally conductive layer 40 is formed on the bottom surface 20b of the chip 20. The electrically and thermally conductive layer 40 can be formed by sputtering, evaporation deposition, chemical deposition, electroplating, or any combination thereof, but the present disclosure is not limited thereto.

The electrically and thermally conductive layer 40 is disposed on the bottom surface 20b of the chip 20 and is in contact therewith, such that the heat produced by the chip 20 can be effectively conducted to the outside. The electrically and thermally conductive layer 40 can be single-layered or multi-layered. While the electrically and thermally conductive layer 40 is single-layered, the electrically and thermally conductive layer 40 can be made of metal, alloy, or other electrically conductive material.

While the electrically and thermally conductive layer 40 is multi-layered, each layer of the electrically and thermally conductive layer 40 can be made of the same material or different materials. For instance, the electrically and thermally conductive layer 40 can be made of any combination of various metals, e.g., titanium, copper, zinc, nickel, silver, gold, and tin. Furthermore, the electrically and thermally conductive layer 40 can be made of a single layer of metal or by combining multiple layers of metals. In the embodiment of the present disclosure, the thickness of the electrically and thermally conductive layer 40 ranges from 10 μm to 50 μm, thereby the thickness of the electrically and thermally conductive layer 40 achieve a better heat dissipation effect on the chip 20.

Since the electrically and thermally conductive layer 40 can be directly attached to the chip 20, almost no gap or thermal resistance, which may affect the heat dissipation effects, are formed between the electrically and thermally conductive layer 40 and the bottom surface 20*b* of the chip 20. Accordingly, in contrast to using only a metal material or an organic thermal conductive composite material to adhere to or abut against the bottom surface 20*b* of the chip 20, the electrically and thermally conductive layer 40 of the embodiment of the present disclosure can be closely attached to the chip 20 to improve the heat dissipation effect on the chip 20.

In addition, the step of forming the lower-layer redistribution circuit structure 60 at least includes forming at least one lower metallic solder pad 601 and a lower dielectric layer 600. The lower metallic solder pads 601 are electrically connected to the circuit board 10. Furthermore, the lower metallic solder pads 601 are electrically connected to the first wire layer 101 through the second opening pattern of the first dielectric layer 103. The lower dielectric layer 600 is on the first surface 10*a* of the circuit board 10 and covers a part of the electrically and thermally conductive layer 40 and a part of the lower metallic solder pads 601. The lower dielectric layer 600 has a heat dissipating opening 600*a* and a solder pad opening 600*b* to expose the part of the electrically and thermally conductive layer 40 and the part of part of the lower metallic solder pads 601, respectively.

Therefore, the electrically and thermally conductive layer 40 can conduct the heat produced by the chip 20 to an external environment through the heat dissipating opening 600*a*. In addition, a plurality of electrically conductive bumps (which are omitted in the figures of the present disclosure) can be disposed in the solder pad opening 600*b* of the lower dielectric layer 600, such that another circuit board or component, e.g., another chip package module, can be disposed on the chip package module M1 and electrically connected thereto. The electrically conductive bumps can include solder balls and under bump metallurgy.

The electrically conductive pillars 501*a*, 501*b*, the interconnect circuit layer 502, the second upper dielectric layer 503, the upper metallic solder pad 504 and the lower metallic solder pad 601 can be made of metal, alloy, or electrically conductive composite material. Such metal or alloy can be selected from a group consisting of copper, silver, nickel, gold, tin, and any combination thereof. In addition, the electrically conductive composite material can be, for example, silver paste or carbon paste.

Accordingly, as shown in FIG. 10, the embodiment of the present disclosure provides a chip package module M1 with heat dissipation function, and the chip package module M1 with heat dissipation function at least includes a circuit board 10, a chip 20, a molding material 30 and an electrically and thermally conductive layer 40.

The circuit board 10 has the first surface 10*a* and the second surface 10*b* opposite to the first surface 10*a*, and the circuit board 10 is a composite board with the multi-layer structure. In the present embodiment, the circuit board 10 at least includes the core substrate 100, the first wire layer 101, the second wire layer 102, the first dielectric layer 103, and the second dielectric layer 104.

The first wire layer 101 and the second wire layer 102 are respectively disposed on two opposite sides of the core substrate 100 and electrically connected to each other through the electrically conductive through holes 100*h*. The first dielectric layer 103 and the second dielectric layer 104 are disposed on two opposite sides of the core substrate 100, respectively. In the present embodiment, the first dielectric layer 103 and the second dielectric layer 104 are the two outermost layers of the circuit board 10, respectively.

The first dielectric layer 103 is disposed on the first wire layer 101, and the first dielectric layer 103 has the first opening pattern 103*p* to expose a part of the first wire layer 101. In addition, the second dielectric layer 104 is disposed on the second wire layer 102, and the second dielectric layer 104 has the second opening pattern 104*p* to expose a part of the second wire layer 102.

As shown in FIG. 10, the circuit board 10 provided in the embodiment of the present disclosure has the chip accommodating space 100S, and the chip accommodating space 100S extends from the first surface 10*a* of the circuit board 10 to the second surface 10*b* of the circuit 10. The chip 20 is disposed in the chip accommodating space 100S, that is, the chip 20 is disposed inside the circuit board 10. The chip 20 can be, for example, a power chip, a passive component, or a sensor chip, but not limited thereto.

It should be noted that, in the embodiment of the present disclosure, the thickness of the chip 20 would be approximately the same as the thickness of the circuit board 10. Accordingly, the thickness of the chip 20 would be greater than the thickness of the core substrate 100.

The chip 20 has the active surface 20*a* and the bottom surface 20*b* opposite to the active surface 20*a*. In addition, the chip 20 further has at least one solder pad 200 (which is exemplified as two in FIG. 10) on the active surface 20*a*. In the embodiment of the present disclosure, the active surface 20*a* of the chip 20 and the second wire layer 102 are disposed facing the same direction. That is, the solder pads 200 of the chip 20 and the second wire layer 102 are on the same side of the core substrate 100.

The molding material 30 is filled between the side surface 20*s* of the chip 20 and the side wall defining the chip accommodating space 100S, such that the chip 20 is fixed on the circuit board 10. That is, the molding material 30 is filled into the gap defined between the side surface 20*s* of the chip 20 and the side wall defining the chip accommodating space 100S. Accordingly, the molding material 30 would surround and cover at least a part of the side surface 20*s* of the chip 20.

In the embodiment of the present disclosure, the molding material 30 would cover the entire side surface 20*s* of the cover 20, and one of the surfaces 30*a* of the molding material 30 and the second surface 10*b* of the circuit 10 would be coplanar. In addition, another surface 30*b* of the molding material 30 and the first surface 10*a* of the circuit board 10 (which is also the outer surface of the first dielectric layer 103) are coplanar.

It should be noted that, in the embodiment of the present disclosure, the molding material 30 only covers the side surface 20*s* of the chip 20 and would not cover the solder pads 200 on the active surface 20*a* of the chip 20.

Referring to FIG. 10, the electrically and thermally conductive layer 40 is disposed on the bottom surface 20*b* of the chip 20 and is in contact therewith, thereby effectively conducting the heat produced by the chip 20 to the outside. The material and the structure of the electrically and thermally conductive layer 40 have been introduced in the foregoing embodiment, and therefore relevant descriptions will be omitted herein.

In the embodiment of the present disclosure, the thickness of the electrically and thermally conductive layer 40 ranges from 10 μm to 50 μm, so that the electrically and thermally conductive layer 40 has the better heat dissipation effect on the chip 20. The electrically and thermally conductive layer 40 can be directly attached to the chip 20, so that almost no gap and thermal resistance are formed between the electrically and thermally conductive layer 40 and the bottom surface 20b of the chip 20, thereby the electrically and thermally conductive layer 40 can provide the better heat dissipation effect on the chip 20.

In addition, in the embodiment of the present disclosure, the chip package module M1 with heat dissipation function further includes an upper-layer redistribution circuit structure 50. The upper-layer redistribution circuit structure 50 is disposed on the second surface 10b of the circuit 10 and is electrically connected to the chip 20, so that the chip 20 can be electrically connected to the external circuit.

As described previously, the upper-layer redistribution circuit structure 50 includes the first upper dielectric layer 500, the electrically conductive pillars 501a, 501b, the interconnect circuit layer 502, and the second upper dielectric layer 503. Each one of the solder pads 200 of the chip 20 can be electrically connected to the upper metallic solder pad 504 through the electrically conductive pillars 501a and the interconnect circuit layer 502. Accordingly, another component can be electrically connected to the chip 20 through the upper metallic solder pad 504. Descriptions of the detailed structure of the first upper dielectric layer 500, the electrically conductive pillars 501a, 501b, the interconnect circuit layer 502, and the second upper dielectric layer 503 will be omitted herein.

The chip package module M1 with heat dissipation function further includes the lower-layer redistribution circuit structure 60, which is on the first surface 10a of the circuit 10. The lower-layer redistribution circuit structure 60 includes at least one lower metallic solder pad 601 and the lower dielectric layer 600.

The lower metallic solder pads 601 and the electrically and thermally conductive layer 40 are co-disposed on the first surface 10a of the circuit board 10. Furthermore, the lower metallic solder pads 601 are electrically connected to the first wire layer 101 through the first opening pattern 103p of the first dielectric layer 103.

The lower dielectric layer 600 is on the first surface 10a of the circuit 10 and covers a part of the electrically and thermally conductive layer 40 and a part of the lower metallic solder pads 601. Furthermore, the lower dielectric layer 600 has at least one heat dissipating opening 600a to expose a part of the electrically and thermally conductive layer 40 under the chip 20. Therefore, the electrically and thermally conductive layer 40 can conduct the heat produced by the chip 20 to the external environment through the heat dissipating openings 600a.

In addition, the lower dielectric layer 600 further has at least one solder pad opening 600b (which is exemplified as two in FIG. 10) to expose another part of the lower metallic solder pads 601 under the first surface 10a of the circuit board 10. Accordingly, the electrically conductive bumps (which are omitted in the figures of the present disclosure) can be disposed in the solder pad opening 600b of the lower dielectric layer 600, such that another circuit board or component, e.g., another chip package module, can be disposed on the chip package module M1 and electrically connected thereto. The electrically conductive bumps can include solder balls and under bump metallurgy. Another chip package module can be a chip package module, a sensor chip package module, or a passive chip package module, but not limited thereto.

Beneficial Effects of Embodiments

In conclusion, one beneficial effect of the present disclosure is that the chip package module with heat dissipation function and the manufacturing method thereof provided in the present disclosure can improve the accuracy of the alignment between the circuit board 10 and the chip 20 through the technical aspects of "providing a temporary carrier P having an alignment pattern P10", "disposing a circuit board 10 on the temporary carrier P according to the alignment pattern P10" and "disposing a chip 20 with an active surface 20a thereof facing the temporary carrier P in the chip accommodating space 100S according to the alignment pattern P10". Therefore, when the upper-layer redistribution circuit structure 50 and the lower-layer redistribution circuit structure 60 are subsequently formed, a change in the relative position between the upper redistribution circuit structure 50 and the lower redistribution circuit structure 60 and the chip 20, which could cause a short circuit or an open circuit, can be prevented.

In addition, the chip package module with heat dissipation function and the manufacturing method thereof provided in the present disclosure can improve on the heat dissipation effect of the electrically and thermally conductive layer 40 on the chip 20 through the technical aspect of "the electrically and thermally conductive layer 40 is disposed on the bottom surface 20b of the chip 20 and is in contact therewith". Furthermore, the electrically and thermally conductive layer 40 is directly attached to the chip 20, such that no gap is formed between the electrically and thermally conductive layer 40 and the bottom surface 20b of the chip 20. Therefore, the electrically and thermally conductive layer 40 can provide the better heat dissipation effect on the chip 20.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A manufacturing method of chip package module with heat dissipation function, comprising:
   providing a temporary carrier having an alignment pattern, wherein the temporary carrier includes a base and a peelable adhesive material disposed on the base;
   disposing a circuit board on the temporary carrier according to the alignment pattern, wherein the circuit board has a chip accommodating space passing therethrough;
   disposing a chip with an active surface thereof facing the temporary carrier in the chip accommodating space according to the alignment pattern, wherein the chip is fixed on the temporary carrier by the peelable adhesive material;
   filling the chip accommodating space with a molding material so that the chip is connected to and fixed on the circuit board, and an initial package structure is therefore formed;
   separating the initial package structure from the temporary carrier, wherein a bottom surface of the chip is exposed from a bottom side of the initial package structure; and
   forming an electrically and thermally conductive layer at the bottom side of the initial package structure, wherein the electrically and thermally conductive layer is in direct contact with the bottom surface of the chip and covers the bottom surface of the chip.

2. The manufacturing method according to claim 1, wherein the alignment pattern includes at least one circuit board alignment mark and at least one chip alignment mark, in a step of disposing the circuit board on the temporary carrier, the circuit board is disposed on the temporary carrier corresponding to the at least one circuit board alignment mark, and the at least one chip alignment mark is exposed from the chip accommodating space.

3. The manufacturing method according to claim 1, wherein the alignment pattern includes at least one chip alignment mark, the chip has at least one solder pad on the active surface, in the step of disposing the chip in the chip accommodating space, the at least one solder pad is disposed on the temporary carrier corresponding to the at least one chip alignment mark.

4. The manufacturing method according to claim 1, wherein the chip has at least one solder pad on the active surface, when the chip is disposed on the chip accommodating space, the at least one solder pad is partially embedded into the peelable adhesive material.

5. The manufacturing method according to claim 1, wherein the base and the peelable adhesive material are made of transparent materials.

6. The manufacturing method according to claim 1, wherein the circuit board includes a core substrate, a first wire layer, and a second wire layer, the first wire layer and the second wire layer are respectively located on two opposite sides of the core substrate, and a thickness of the chip is greater than a thickness of the core substrate.

7. The manufacturing method according to claim 6, wherein the circuit board further includes a first dielectric layer, and a second dielectric layer, the first dielectric covers the first wire layer and has a first opening pattern to expose a part of the first wire layer, the second dielectric layer is disposed on the second wire layer and has a second opening pattern to expose a part of the second wire layer.

8. The manufacturing method according to claim 7, wherein the first dielectric layer or the second dielectric layer is made of polyimide, benzocyclobutene, silica gel, or resin.

9. The manufacturing method according to claim 1, further comprising: one surface of the circuit board and one surface of the molding material being coplanar with each other after the step of filling the chip accommodating space with the molding material.

10. The manufacturing method according to claim 1, further comprising:
forming a lower-layer redistribution circuit structure at the bottom side of the initial package structure; and
forming an upper-layer redistribution circuit structure on a top side of the initial package structure.

11. The manufacturing method according to claim 10, wherein the step of forming the lower-layer redistribution circuit structure at least includes: forming at least one lower metallic solder pad and a lower dielectric layer, wherein the lower metallic solder pad is electrically connected to the circuit board, and a heat dissipating opening and a solder pad opening are formed on the lower dielectric layer to respectively expose a part of the electrically and thermally conductive layer and a part of the lower metallic solder pad.

12. A chip package module with heat dissipation function, comprising:
a circuit board having a chip accommodating space passing therethrough;
a chip disposed in the chip accommodating space, the chip having an active surface and a bottom surface opposite to the active surface;
a molding material filled between a side surface of the chip and a side wall defining the chip accommodating space, so that the chip is fixed on the circuit board;
an electrically and thermally conductive layer being disposed on the bottom surface of the chip and being in contact therewith; and
a lower-layer redistribution circuit structure, wherein the lower-layer redistribution circuit structure and the electrically and thermally conductive layer are located on the same side of the circuit board, and the lower-layer redistribution circuit structure has at least one heat dissipating opening to expose a part of the electrically and thermally conductive layer.

13. The chip package module with heat dissipation function according to claim 12, wherein the circuit board includes a core substrate, a first wire layer, and a second wire layer, the first wire layer and the second wire layer are respectively formed on two opposite sides of the core substrate, a thickness of the chip is greater than a thickness of the core substrate, and at least one solder pad is disposed on the active surface of the chip and arranged at the same side as the second wire layer.

14. The chip package module with heat dissipation function according to claim 13, wherein the circuit board further includes a first dielectric layer and a second dielectric layer, the first dielectric layer covers the first wire layer and has a first opening pattern to expose a part of the first wire layer, the second dielectric layer is disposed on the second wire layer and has a second opening pattern to expose a part of the second wire layer.

15. The chip package module with heat dissipation function according to claim 12, wherein the thickness of the electrically and thermally conductive layer ranges from 10 μm to 50 μm.

* * * * *